United States Patent
Bhatti et al.

(10) Patent No.: US 6,422,307 B1
(45) Date of Patent: Jul. 23, 2002

(54) ULTRA HIGH FIN DENSITY HEAT SINK FOR ELECTRONICS COOLING

(75) Inventors: Mohinder Singh Bhatti, Amherst; Russell S. Johnson, Tonawanda; Shrikant M. Joshi, Williamsville, all of NY (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/908,327

(22) Filed: Jul. 18, 2001

(51) Int. Cl.[7] .................................................. F28F 7/00
(52) U.S. Cl. ..................... 165/185; 165/80.3; 174/16.3; 257/722; 361/704; 361/697
(58) Field of Search ................................ 165/80.3, 185; 29/890.03

(56) References Cited

U.S. PATENT DOCUMENTS

| | | | |
|---|---|---|---|
| 4,450,472 A | * | 5/1984 | Tuckerman et al. ....... 165/80.3 |
| 4,923,003 A | | 5/1990 | Stenlund et al. |
| 4,964,459 A | | 10/1990 | Stenlund et al. |
| 5,304,846 A | * | 4/1994 | Azar et al. .................... 257/722 |
| 5,367,433 A | * | 11/1994 | Blomquist .................... 165/185 |
| 5,590,712 A | * | 1/1997 | Fisher et al. ................. 165/185 |
| 5,808,236 A | * | 9/1998 | Brezina et al. ............. 165/80.3 |
| 5,969,950 A | * | 10/1999 | Tantoush .................... 165/80.3 |
| 6,125,037 A | * | 9/2000 | Bollesen ..................... 361/704 |

* cited by examiner

Primary Examiner—Terrell McKinnon
(74) Attorney, Agent, or Firm—Patrick M. Griffin

(57) ABSTRACT

The present invention is directed to liquid-cooled or air-cooled metallic heat sinks formed as unibody structures that include a planar base and upright fins. The fins are located on one side of the heat sink and the ratio of fin spacing to fin height is low. In order to achieve low value of the ratio of fin spacing to fin height, a fin density of greater than about twelve fins per centimeter is employed. The length of the fins in the flow direction is restricted in order to yield high rate of heat dissipation from the finned surface. Furthermore, flow of the cooling fluid over the fins is maintained laminar in order to reduce the noise level and pumping power for the fluid.

5 Claims, 1 Drawing Sheet

ULTRA HIGH FIN DENSITY HEAT SINK FOR ELECTRONICS COOLING

TECHNICAL FIELD

The present invention is directed to heat sinks primarily for use in dissipating waste heat generated by electronics such as power modules, transistors, microprocessor components and assemblies, and especially computer chips. These heat sinks, comprising a planar base and upright fins, provide high heat transfer from concentrated heat sources using a cooling fluid flowing through the heat sink under laminar flow conditions. The fins are located on one side of the base plate and are arranged in columns and rows that define parallel channels for fluid flow.

BACKGROUND OF THE INVENTION

Research activities have focused on developing heat sinks to efficiently dissipate heat from highly concentrated heat sources such as microprocessors and computer chips. These heat sources typically have power densities in the range of 4 to 10 watts per square centimeter (3.5 to 9 Btu per second per square foot) and relatively small available space for placement of fans, heat exchangers, heat sinks and the like.

The typical liquid-cooled heat sinks have a fin density in the range of 2 to 7 fins per centimeter (6 to 18 fins per inch) and a fin height in the range of 2 to 5 millimeters (0.08 to 0.2 inch). Typical air-cooled heat sinks, on the other hand, have a fin density of about 3 to 10 fins per centimeter (8 to 25 fins per inch) and a fin height of about 10 to 15 millimeters (0.4 to 0.6 inch). Also fin thickness of 0.05 to 0.25 mm (0.002 to 0.01 inch) is common depending on the fin material.

Existing liquid-cooled heat sinks used for these purposes have generally used a high heat capacity-rate fluid such as water or water-glycol solution to transfer heat from the electronic heat source to the cooling fluid stream typically air. A typical liquid-cooled heat sink for electronics consists of a copper block with drilled circular passages for liquid flow that are connected in a serpentine pattern by means of hairpin tubes. The electronic heat source is bonded to one face of the block and cooling liquid flows through the drilled circular passages. Heat sinks of this type have also used a serpentine tube mounted on one side of a plate with the electronic heat source bonded on the other side of the plate. These types of heat sinks provide low heat transfer rate due to the wide spacing of the serpentine flow passages. Also, they tend to be heavy.

Existing air-cooled heat sinks used for these purposes comprise an array of parallel fins on one side of a plate. The electronic heat source is bonded to the opposite side of the plate. The parallel fins bonded to the plate form channels with relatively large aspect ratio of the channel width to channel height. Cooling air is drawn through the fins by means of a fan generally placed over the fins. The cooling capacity of such heat sinks tends to be low due to low heat capacity of air.

In conventional electronics cooling heat exchangers, turbulent flow with high flow velocity is necessary in order to achieve good heat transfer. This results in high pumping power for the cooling fluid. In addition, the high velocity turbulent flow contributes to the noise level of the electronic device, which is not desirable. Motivated by these considerations, a low velocity laminar flow is employed in the present invention so as to lower the pumping power and to reduce the noise associated with high velocity turbulent flow.

SUMMARY OF THE INVENTION

The present invention is directed to liquid-cooled or air-cooled metallic heat sinks such as those made of aluminum or aluminum-based alloys and copper or copper-based alloys. These heat sinks are capable of dissipating heat generated by concentrated heat sources using relatively low velocity larninar flow of the cooling fluid. The heat sinks are formed as a singular structure by casting, pressing, extruding, forging or by machining operations like electron discharge machining (EDM) and milling. As formed, the present heat sink comprises a planar base with integrated vertical fins on one side. The fins are arranged so that they cover the base to form parallel arrays across its width. The parallel fin arrays extend in a serial fashion along the flow length of the base with intervening gaps between successive arrays.

DESCRIPTION OF THE PREFERRED EMBODIMENT

Figure 1:
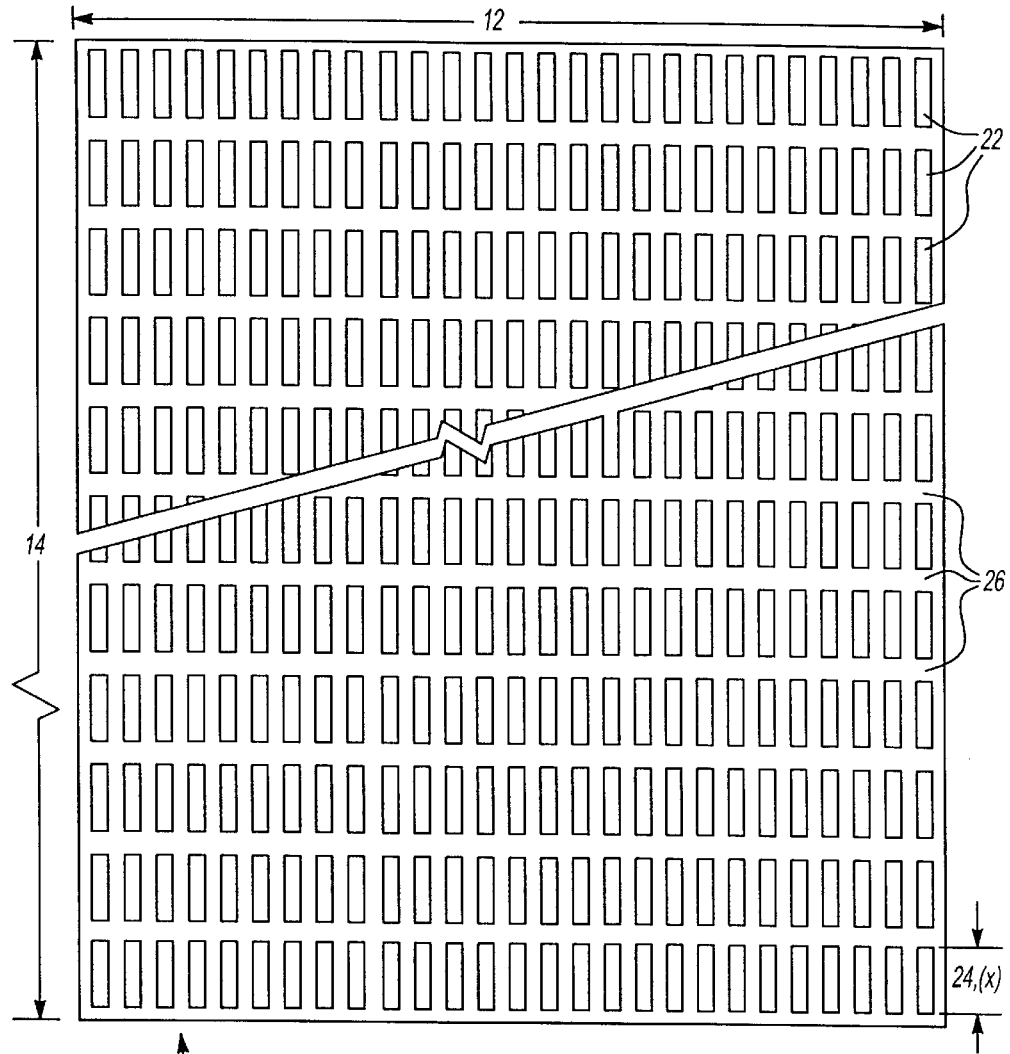
FIG. 1 depicts the top view of a heat sink of the present invention showing an array of parallel fins each of length x in the flow direction.

The rationale for the selection of the arrays of parallel fins of relatively low spacing to height ratio can be understood with the help of the following simple analysis.

The prescribed rate of generation of heat $\dot{q}$ by the electronic heat source bonded to the plate can be expressed via Newton's cooling law as $$\dot{q}=hA(T_w-T_m) \tag{1}$$

where h is the heat transfer coefficient within the flow passages, A is the total heat transfer area of the passages, $T_w$ is the passage wall temperature and $T_m$ is the fluid mean temperature.

The fins bonded to the base plate of the heat sink form an array of rectangular flow passages, which can be characterized by the passage aspect ratio α defined as $$\alpha = \frac{passage\ width}{passage\ height} = \frac{2a}{2b} \tag{2}$$

The heat transfer coefficient h entering Eq. (1) is a strong function of the passage aspect ratio α. With α=1, the flow passage is a square while with α=0, it degenerates into a parallel plate channel. The highest value of h in the entire range $0 \leq \alpha \leq 1$ for the rectangular family of passages is for parallel plate channel (α=0) while the lowest value of h is for the square passage (α=1). The heat transfer coefficient h of the parallel plate channel passage (α=0) is up to 60.5% higher than that of the square passage (α=1). Thus, for a more efficient s heat sink α→0. To all intents and purposes, a rectangular passage is considered a parallel plate channel when $\alpha \leq 0.15$.

The heat transfer coefficient h and the friction factor f go hand-in-hand. Thus, like the heat transfer coefficient h, the highest value of the friction factor f in the entire range $0 \leq \alpha \leq 1$ for the rectangular family of passages is for parallel plate channel (α=0) while the lowest value of f is for the square passage (α=1). The friction factor f of the parallel plate channel passage ($\alpha=0$) is up to 68.7% higher than that of the square passage ($\alpha=1$).

A direct consequence of the higher value of the friction factor f is the higher pressure drop $\Delta P$ in the flow passage as can be inferred from the following general relation $$\Delta P = \frac{2 f x \rho u_m^2}{g_c d} \quad (3)$$

Here f is the dimensionless friction factor, x is the passage length in the flow direction, $\rho$ is the fluid density, $u_m$ is the flow mean velocity, $g_c = 32.174$ ($lb_m/lb_f$)ft/s$^2$ is the constant of proportionality in Newton's second law of motion and d is the hydraulic diameter of the passage defined as $$d = \frac{4 \times \text{cross sectional area}}{\text{perimeter}} \quad (4)$$

For a rectangular passage with width 2a and height 2b, Eq. (4) yields the hydraulic diameter d as $$d = \frac{4ab}{a+b} \quad (5)$$

Having established that parallel plate passages ($\alpha \rightarrow 0$) in laminar flow are capable of relatively high heat transfer rate $\dot{q}$ albeit at the expense of the pressure drop $\Delta P$ penalty, the heat transfer rate $\dot{q}$ may be enhanced by restricting the passage length x so that the flow never gets a chance to become fully developed, i.e., completely viscous.

Based on the analytical relations presented in the reference M. S. Bhatti and C. W. Savery, *Heat Transfer in the Entrance Region of a Straight Channel: Laminar Flow with Uniform Wall Heat Flux*, American Society of Mechanical Engineers, Journal of Heat Transfer, Vol. 99, pp. 142–144, 1977, it can be shown that the parallel plate passage length x in the flow direction can be determined using the relation $$\frac{x}{a} = \left[ \frac{594U^2 + 90U - 684 - 15U\ln(3-2U) - 1308U\ln U}{1120U} \right] Re \quad (6)$$

where $U = u_c/u_m$ is the dimensionless velocity being the ratio of the flow velocity $u_c$ along the center line of the parallel plate passage formed by the upright fins on the base plate and $u_m$ is the flow mean velocity through the passage. The values of U range between U=1 at x=0 and U=1.5 at x=$\infty$. The smaller the value of U the higher is the value of the heat transfer coefficient h and the friction factor f.

The dimensionless Reynolds number Re entering Eq. (4) is defined as $$Re = \frac{\rho u_m d}{\mu} \quad (7)$$

where $\mu$ is the dynamic viscosity of the fluid and the remaining symbols $\rho$, $u_m$ and d are already defined in the context of Eq. (3).

For the present invention, it is preferred that the heat sinks have values of U that are within 10% of its ultimate value (U=1.5), i.e., U=1.35. Introducing this value into Eq. (6), it is determined that the parallel plate passage length x in the flow direction must be restricted to $$x/a \leq 0.0096 Re \quad (8)$$

The values of Re entering Eqs. (6) and (8) are restricted to be Re<2,300 to ensure that the fluid flow through the parallel plate channel passages remains laminar in order to yield low pumping power and noise.

Consistent with the value of the parallel plate channel passage length x given in Eq. (6), the average friction factor f over the flow length x for developing laminar flow in the parallel plate channel is given as $$f = \frac{66U^2 - 30U - 36 - 45\ln(3-2U)}{140(x/a)} \quad (9)$$

Depending on the chosen value of U in the range 1<U<1.5, the value of $x/a$ can be determined using Eq. (6) and the value of f using Eq. (9). For example, with U=1.35, $x/a$=20 0.0096Re and f=72.89/Re.

The average heat transfer coefficient h over the parallel plate channel passage length x for developing laminar flow under conditions of uniform wall temperature is given in terms of the dimensionless Nusselt number Nu as $$Nu \equiv \frac{hd}{k} = 7.5407 + \frac{0.024 Gz^{1.14}}{1 + 0.0358 Pr^{0.17} Gz^{0.64}} \quad (10)$$

where k is the thermal conductivity of the fluid and Pr and Gz are respectively the dimensionless Prandtl number and Graetz number defined as $$Pr \equiv \frac{\mu c_p}{k} \quad (11)$$

$$Gz \equiv \frac{RePr}{x/d} \quad (12)$$

where $c_p$ is the isobaric specific heat of the fluid and the remaining symbols are previously defined.

Knowing h with the use of Eqs. (10) for developing laminar flow, the heat dissipation rate $\dot{q}$ can be determined using Eq. (1). The ultra high fin density, in the range of 12 to 32 fins per centimeter (30 to 81 fins per inch), of the heat sinks of the present invention yields a high value of the heat transfer area A while the parallel plate channel configuration of the fins, gives a high value of the heat transfer coefficient h. The result of the high values of h and A is the high value of thermal conductance hA or equivalently low value of the thermal resistance 1/hA. Thus, as per Eq. (1), the rate of dissipation of heat $\dot{q}$ is high with high value of hA.

By the following example, the teachings of the present invention are illustrated to size a preferred heat sink by the use of the foregoing relations.

Example

An air-cooled heat sink of the present invention is made with a fin density n=35 fins per inch and fin thickness $\delta$=0.002 inch. The aspect ratio $\alpha$ of the fin spacing 2a to fin height 2b is 0.08. The packaging constraints call for a heat sink width w=3.25 inches.

The heat sink is intended to dissipate 200 Watts (0.1896 Btu/s) of power $\dot{q}$ into an air stream flowing at a mass flow rate $\dot{m}$=0.04 $lb_m$/s. The temperature $T_{ai}$ of the incoming air is 100° F. and the flow mean velocity urn of the air through the fins is 25 ft/s. The average wall temperature $T_w$ of the fin surface is 122° F.

The transport properties of the cooling air are as follows.

Density $\rho=0.0749$ $lb_m/ft^3$

Thermal conductivity $k=0.0000041$ Btu/ft s °F.

Isobaric specific heat $c_p=0.2410$ Btu/$lb_m$ °F.

Dynamic viscosity $\mu=0.0000123$ $lb_m$/ft s

Prandtl number Pr=$\mu c_p/k$=0.7230

In order to find the fin spacing $2a$, it is noted that the fin density n implies that there are n fins per unit length which translates to n−1 fin gaps per unit length. Assuming the fin gaps to be uniform, this means that the nominal fin spacing is 1(n−1). Taking cognizance of the fact that each fin takes away half fin thickness $\delta/2$ from the nominal fin spacing, the actual fin spacing $2a=1/(n-1)-\delta$. Introducing n =35 fins per inch and $\delta$=0.002 inch, found that $2a$=0.0274 inch. Knowing the parallel plate passage aspect ratio $\alpha$=0.08, the fin height $2b$ is calculated to be 0.3426 since $\alpha=2a/2b$. Knowing a and b, the hydraulic diameter d is calculated to be 0.0507 inch with the use of Eq. (5).

Given the air density $\rho=0.0749$ $lb_m/ft^3$, air dynamic viscosity $\mu=0.0000123$ $lb_m$/ft s, flow mean velocity $u_m$=25 ft/s and the flow passage hydraulic diameter d =0.0507/12 ft, the Reynolds number Re is calculated to be 644 with the use of Eq. (7). This value of Re is within the limits of the values of Re<2,300 to ensure laminar flow conditions. Substituting Re=644 and a=0.0137 inch into Eq. (8), the desired fin length x in the flow direction is calculated to be $\leq$0.0847 inch. Adopting the upper bound as the acceptable value, x=0.0847 inch.

Next in order to determine the total number of fins in the plate, the total surface area A of the fins is first determined. This area can be calculated with the use of Eq. (1). Assuming the temperature gradients in the heat sink to be mild, the air mean temperature $T_m$ entering Eq. (1) can be taken as the arithmetic mean of the air inlet temperature $T_{ai}$=100° F. and as yet undetermined air outlet temperature $T_{ao}$. This latter temperature can be determined using the simple energy balance $\dot{q}=\dot{m}c_p(T_{ao}-T_{ai})$ where the prescribed heat dissipation rate $\dot{q}$=0.1896 Btu/s, the mass flow rate of air $\dot{m}$=0.04 $lb_m$/s, the isobaric specific heat of air $c_p$=0.2410 Btu/$lb_m$ °F. and the air inlet temperature $T_{ai}$=100° F. Introducing these values into the simple energy balance, we obtain $T_{ao}$=120° F. whence $T_m$=(100+120)/2=110° F.

In order to find the total heat transfer area A from Eq. (1), the average heat transfer coefficient h for the developing laminar flow is needed which can be determined using Eq. (10). To that end, the dimensionless Graetz number Gz defined in Eq. (12) is first calculated. Introducing Re=644, Pr=0.7230, x=0.0847 inch and d=0.0507 inch into Eq. (12), Gz=279. Using this value of Gz together with Pr=0.7230, the dimensionless Nusselt number Nu =hd/k=14.1023 whence using the thermal conductivity k of air=0.0000041 Btu/ft s °F. and the hydraulic diameter d=0.0507/12 ft, h=0.0137 Btu/s $ft^2$ °F. Using this value of h together with $\dot{q}$=0.1896 Btu/s, $T_w$=122° F., $T_m$=110° F., A=1.1545 $ft^2$ with the use of Eq. (1). This area is practically the area of the fins assuming the base plate area to be negligible.

The area of the two sides of each fin of height $2b$ and length x is 4bx =4×0.1713×0.0847/144=0.000403 $ft^2$. Dividing the total area A by the area of each fin, the total number of fins is 1.1545/0.000403=2,865. Since the fin density n is 35 fins per inch and the plate width w is 3.25 inches, it follows that the number of fins in each row should be 3.25×35=114. Dividing the total number of fins by the number of fins in each row, the number of rows is 2,865/114=25.13 which can be rounded off to 25 rows. Thus one would employ 25 rows of fins with 114 fins in each row. The total length of the plate in the flow direction will be 25 ×0.0847=2.12 inches since the length of each fin in the flow direction is 0.0847 inch. The total plate length is rounded off to 2.5 inches to provide for the gaps between successive rows of fins.

Finally, in order to find the pressure drop $\Delta p$ in the heat sink, the average friction factor f is determined with the use of Eq. (9). Introducing U=1.35 together with x/a=0.0847/0.0137=6.1825 into Eq. (9), f=0.1132. Using this value of f together with x=0.0847/12 ft, $\rho$=0.0749 $lb_m/ft^3$, $u_m$=25 ft/s, $g_c$=32.174 ($lb_m/lb_f)ft/s^2$ and d=0.0507/12 ft into Eq. (3), the pressure drop through each row is 0.55 $lb_f/ft2$ and since there are 25 rows of fins, the total pressure drop $\Delta P$=25×0.55= 13.76 $lb_f/ft^2$=0.0955 pounds per square inch (or 2.64 inches water) ignoring the pressure drop associated with fin gaps in the flow direction.

Figure 2:
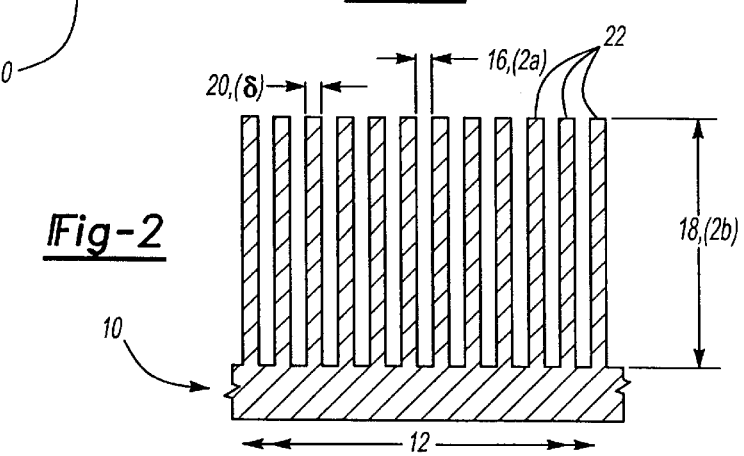
FIG. 2 depicts an enlarged section of FIG. 1 showing a section of the width of the heat sink with fin spacing 2a, fin height 2b and fin thickness δ.

A heat sink of the present invention is shown in FIGS. 1 and 2. It is formed from conducting metals like aluminum and copper as a single structural piece that includes both the base plate and fins. The starting material may be molten, in powder form or a solid block. The unibody heat sink of the present invention is readily distinguished from those known in the art where the base plate and fins are made separately and then joined. Various fabrication techniques may be employed to make heat sinks of the present invention including, but not limited to, the following.

1. heat sink, complete with base plate and fins, cast from molten metal and subsequently machined to impart the desired finish. Such heat sinks are preferred when the desired fin density is low.
2. continuous parallel fins extruded integral with the base plate in which the fins are subsequently cut into discrete lengths by milling or other suitable machining operations. Such heat sinks can be made at extremely fast rate; the fin density is limited to permissible tolerances allowed by the extrusion process.
3. parallel fins machined from a block of metal by electronic discharge machining (EDM) to achieve extremely high fin density. Such heat sinks are preferred when extremely high fin density is necessary and processing time is not important since the machining process is slow.
4. parallel fins formed by a machining process that cuts slots into a block of metal to produce high fin density; fins then cut in perpendicular direction to provide boundary layer interruption in the flow direction.
5. parallel fins formed on two separate plates by extrusion or by any of the machining operations with relatively low fin density in the range of 6 to 16 fins per centimeter (15 to 25 fins per inch). The resulting two finned plates may then be assembled together such that the fins on one plate intermesh with the fins on the other plate to define parallel plate passages with relatively high fin density in the range of 12 to 32 fins per centimeter (30 to 81 fins per inch). The advantages of this technique include ease of extrusion or machining to obtain relatively low fin density on individual plates and relatively high fin density in the assembled heat sink due to intermeshing of the fins on two mating plates.
6. fins formed by a series of operation in dies to form convoluted fins with louvers, if desired. The convoluted fins may then be brazed, soldered or glued to the base plate.
7. heat sink complete with fins and base plate forged from a block of metal.

Referring to FIG. 1, as formed heat sink of the present invention comprises a planar base 10 having a width 12 (w) and a flow length 14, and a plurality of fins 22. The width 12 and the flow length 14 may be determined based on the area necessary to dissipate the generated heat or may be based on package limitations.

Referring to FIG. 2, the fins 22 protrude from the base plate 10 on one side at approximately 90-degree angle from base 10. The fins 22 are aligned face-to-face across width 12 to define a parallel array of fins 22 at a fin density of greater than about 12.0 fins per centimeter (30 fins per inch). Across width 12, the fin spacing 16 (2a) between adjacent fins 22 across width 12 is less than about 0.88 millimeters (0.03 inch). Fins 22 further have a fin height 18 (2b) that is greater than about 2.0 millimeters (0.08 inch) and a fin thickness 20 (δ) that is less than about 0.15 millimeter (0.006 inch). Along width 12, the aspect ratio α, that is the ratio of the fin spacing 16 (2a) to the fin height 18 (2b), is less than about 0.15.

Referring back to FIG. 1, fins 22 are spaced approximately end-to-end separated by small intervening gaps 26 in-between successive fins 22 along flow length 14. These intervening gaps 26 substantially increase the effective heat transfer rate because they interrupt and re-start the formation of the thermal boundary layer. By maintaining the thermal boundary layer thickness within a certain range, the heat transfer coefficient applicable to the heat sink may be maximized over the flow length and the heat transfer rate may, thereby, be maintained as desired.

In the present invention, the preferred fin length 24 (x) is less than about 19 millimeters (0.75 inch). The size of the intervening gaps 26 is generally as small as allowable by manufacturing processing limitations.

The arrangement of fins 22 on the planar base 10 defines parallel arrays along width 12 that are in a series relationship with one another along the flow length 14. The parallel arrays of fins 22 that are in series along the flow length 14, thus, define parallel channels along flow length 14 suitable for flow under laminar flow conditions of a cooling fluid like air, water or water-glycol solution.

Inlet and outlet manifolds can be added onto the heat sinks of the present invention for entry and exit of the cooling fluid. Such manifolds may be joined by brazing, bonding or other mechanical means onto the ends of the heat sink. The heat source, such as a microprocessor or computer chip, can finally be bonded to the flat face of the heat sink.

The advantages of the present heat sink over prior art heat sinks include significantly larger heat transfer surface area packed within a smaller volume and high heat transfer coefficient due to low aspect ratio approaching that of a parallel plate channel configuration.

While the preferred embodiment of the present invention has been described so as to enable one skilled in the art to practice the heat sinks disclosed, it is to be understood that variations and modifications may be employed without departing from the concept and intent of the present invention as defined by the following claims. An example of the obvious variation is to offset the parallel fins in successive rows instead of keeping them in line as depicted in FIG. 1.

The preceding description is intended to be exemplary and should not be read to limit the scope of the invention. The scope of the invention should be determined only by reference to the following claims.

What is claimed is:

1. Liquid or air cooled metallic heat sink formed as a unibody structure comprising, a planar base (10) having width (12) and flow length (14), and a plurality of fins (22) protruding at an angle of about 90 degrees from one side of said planar base (10) wherein said fins (22) are in face-to-face parallel arrays across width (12) and said parallel arrays are arranged in series along flow length (14) with intervening gaps (26) between successive parallel fin arrays, wherein the fin density across width (12) is greater than about 12 fins per centimeter, the fin spacing (16) between adjacent fins across width (12) is less than about 0.88 millimeter, the fin height (18) is greater than about 2 millimeters, the fin thickness (20) is less than about 0.15 millimeter, the fin aspect ratio is less than about 0.15, and the fin length (24) is less than about 19 millimeters, and further wherein the arrangement of fins (22) on said planar base (10) defines parallel channels suitable for the laminar flow of a liquid coolant along the flow length (14).

2. A unibody heat sink of claim 1 made by melting, powder compaction, milling, forging, extrusion, electron discharge machining or progressive dies.

3. A unibody heat sink of claim 1 wherein the ratio of said fin spacing to said fin height is less than 0.15 and said parallel channels are rectangular.

4. A unibody heat sink of claim 1 having fin density up to about 32 fins per centimeter.

5. A unibody heat sink of claim 1 wherein said flow length x in the flow direction is determined by $$\frac{x}{a} = \frac{Re[594U^2 + 90U - 684 - 15U\ln(3-2U) - 1308U\ln U]}{1120U}$$

where 2a is the spacing of the fins (ft)

U is the dimensionless velocity of the flowing fluid in the range $1 < U \leq 1.35$ Re is the dimensionless Reynolds number defined as $$Re = \frac{\rho u_m d}{\mu} \leq 2{,}300$$

where

ρ is the fluid density ($lb_m/ft^3$)

μ is the dynamic viscosity of the fluid ($lb_m$/ft s)

$u_m$ is the flow mean velocity through the flow passage (ft/s)

d is the hydraulic diameter of the flow passage (ft).

* * * * *